(12) United States Patent
Park et al.

(10) Patent No.: US 7,211,372 B2
(45) Date of Patent: May 1, 2007

(54) LIQUID CRYSTAL DISPLAY SUBSTRATE FABRICATION

(75) Inventors: Soon-Young Park, Gyungsangnam-Do (KR); Deok-Won Lee, Kyunggi-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 478 days.

(21) Appl. No.: 10/723,491

(22) Filed: Nov. 25, 2003

(65) Prior Publication Data
US 2004/0125331 A1      Jul. 1, 2004

(30) Foreign Application Priority Data
Dec. 28, 2002   (KR)   ............. 10-2002-0086066

(51) Int. Cl.
*G03F 7/213*   (2006.01)
(52) U.S. Cl. .............. 430/321; 430/319; 430/394
(58) Field of Classification Search ............. None
See application file for complete search history.

(56) References Cited

U.S. PATENT DOCUMENTS

| | | | |
|---|---|---|---|
| 5,437,946 A * | 8/1995 | McCoy | 430/5 |
| 5,888,676 A | 3/1999 | Saitoh | |
| 6,204,912 B1 * | 3/2001 | Tsuchiya et al. | 355/53 |
| 6,288,772 B1 * | 9/2001 | Shinozaki et al. | 355/53 |
| 6,444,399 B1 | 9/2002 | Nakasuji | |
| 6,577,366 B1 | 6/2003 | Kim et al. | |
| 6,583,854 B1 | 6/2003 | Hazama et al. | |

* cited by examiner

*Primary Examiner*—John A. McPherson
(74) *Attorney, Agent, or Firm*—Brinks Hofer Gilson & Lione (57) ABSTRACT

In order to prevent exposure mismatch on a boundary between exposure regions that causes pattern connection defects (including stitch defects), exposure is performed twice or more on a whole exposure region of a glass substrate. The exposure method includes aligning a reticle in a scanning direction, exposing the reticle pattern onto the glass substrate, moving the glass substrate one-half of the width of the reticle, and exposing an exposure area twice by repeating the exposing and moving steps.

9 Claims, 6 Drawing Sheets

LIQUID CRYSTAL DISPLAY SUBSTRATE FABRICATION

BACKGROUND OF THE INVENTION

1. Field of the Invention

The present invention relates to LCD (Liquid Crystal Display) panel substrate fabrication, and more particularly to an exposure method and system for fabricating an LCD panel substrate without stitch defects.

2. Description of the Prior Art

The exposure apparatus used for fabricating a liquid crystal display device substrate is generally either a step-and-repeat apparatus or a step-and-scanning apparatus. The step-and-repeat apparatus sequentially exposes an exposure region of a unit cell, while the step-and-scanning apparatus transcribes a reticle or a mask pattern onto each exposure region of an array substrate by synchronously moving the reticle or the mask and a substrate in the same direction.

Figure 1:
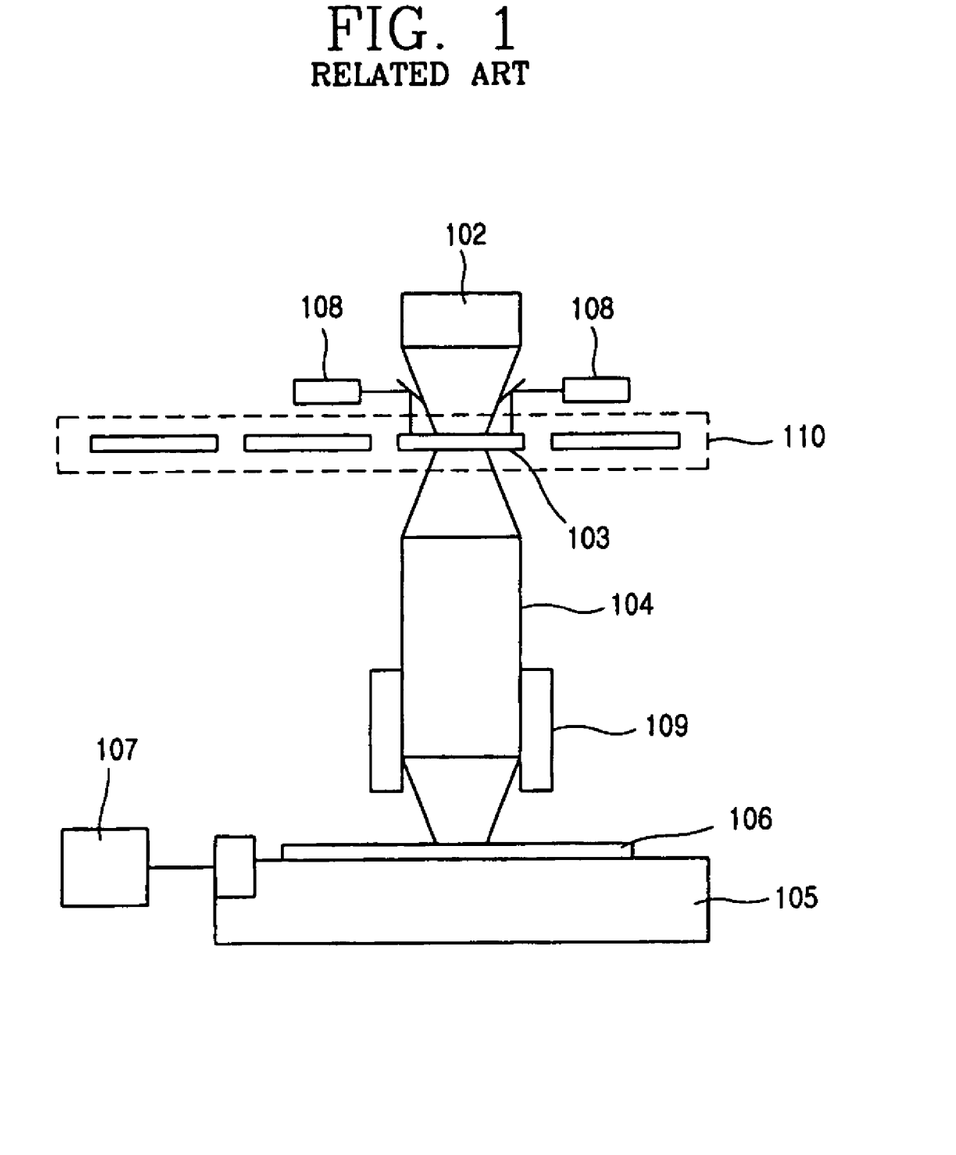
FIG. 1 illustrates a step-and-repeat exposure apparatus.

FIG. 1 shows a conventional projective exposure steppe-and-repeat apparatus for fabricating an LCD substrate. As shown in FIG. 1, an LCD pattern on a reticle or a mask (hereafter, "reticle") 103 is illuminated by an illuminating optical system 102, and is exposed onto a predetermined exposure area on a plate 106. The plate 106 is typically a rectangular glass substrate placed on an XY stage 105.

When a pattern is transferred by the exposure, the plate 106 is moved by a predetermined distance by moving the XY stage 105. The LCD pattern is then exposed onto a new exposure area. Thus, the process of exposing the LCD pattern may occur multiple times in multiple different locations on the plate 106.

When a new pattern from a new reticle is needed, the reticle 103 is exchanged for another reticle by the reticle exchanging mechanism 110. Again, the LCD pattern on the new reticle is sequentially exposed onto a predetermined exposure region a predetermined number of times. As a result, multiple reticle patterns are transferred to the plate 106 at multiple locations.

In the above-described step-and-repeat exposure apparatus, the position of the plate 106 on the XY stage 105 is correctly monitored by a laser interferometer 107, and the coordinates of the position are determined. The alignment of the reticle 103 is performed by a reticle alignment system 108, and the alignment of the plate 106 is performed by a plate alignment system 109.

Figure 2:
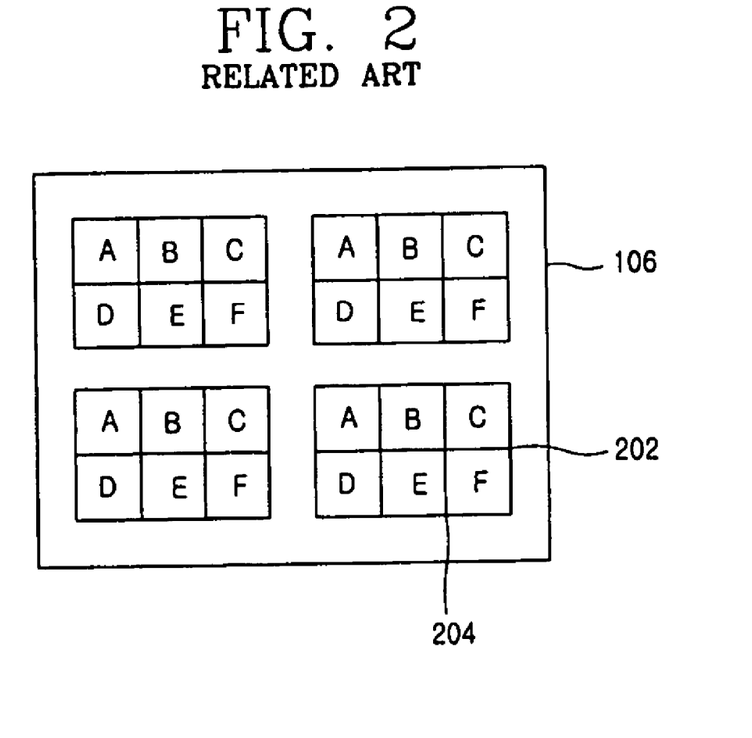
FIG. 2 illustrates LCD substrate pattern arrangement on an underlying substrate.

FIG. 2 shows an example of four LCD substrate patterns transferred to the plate 106 by the exposure apparatus of FIG. 1. As shown in FIG. 2, in transferring the entire LCD substrate pattern, the overall pattern is divided into, for example, six pattern regions labeled A, B, C, D, E and F. At each boundary portion between patterns (as examples, boundary 202 or boundary 204), a small amount of overlap exposure is carried out as the patterns are exposed onto 6 different positions. In the example shown in FIG. 2, each pattern region A, B, C, D, E, and F is exposed through one of six different reticles that holds the appropriate pattern for the pattern region. The six patterns are generated by repeatedly exposing and replacing reticles, thereby forming an entire LCD substrate pattern, four of which are shown in FIG. 2.

Figure 3:
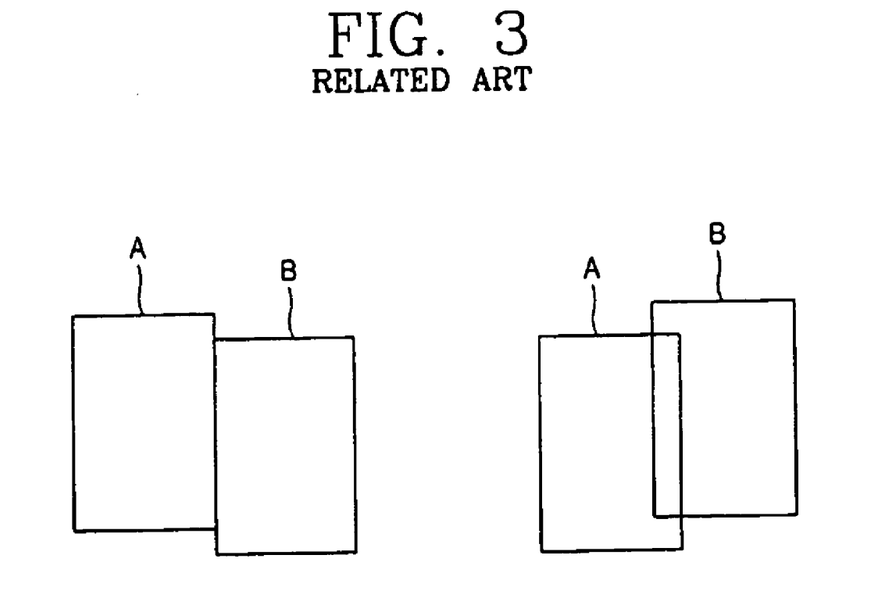
FIG. 3 shows examples of irregular pattern connection.

In exposing a reticle according to the above-described method, there is often an alignment discrepancy that occurs at boundary portions between patterns. FIG. 3 shows two examples of alignment discrepancy that may result from alignment error of the reticle and the plate, the distortion of the projective optical system, and other imperfections in the system.

A examples, when a pattern to be transferred is subject to a rotation error, or when there is a positional error with respect to the positions of the patterns A and B to be transferred, then there is an alignment discrepancy at the boundary of the exposed patterns as shown in FIG. 3. An additional source of alignment discrepancy or overlap error is projection lens distortion in the system.

When any alignment error occurs, there arises the problem that the LCD substrate generated by the exposure process does not have the characteristics that it was designed to have. The LCD substrate is therefore unusable for an LCD display, and represents a waste of time and materials. Not only the step-and-repeat apparatus, but also the step-and-scanning apparatus experience the same problem.

Recently, LCD panels have significantly increased in size, but the size of the exposure region covered by any particular mask has not. Thus, more exposure cycles are necessary to expose the LCD substrate. Accordingly the problem has worsened, even as commercial demand for LCD displays is increasing.

In other words, because an LCD display incorporates a large LCD substrate, exposure has to be performed many times to fabricate the LCD substrate. In an attempt to prevent alignment discrepancy, there have been attempts to carry out exposure using a minute overlap portion between exposures.

Nevertheless, in those attempts, pattern alignment discrepancy occurs between an overlapped region and a non-overlapped region. In other words, in some instances, exposure happens twice in the minute overlap region, exposure happens only once in another region, and pattern discrepancy occurs between the two regions after etching. After completing the fabrication of the liquid crystal display device, the pattern discrepancy looks like a stitch, and accordingly the screen is defective.

Thus, there is a need to address the problems noted above, and others previously experienced.

SUMMARY OF THE INVENTION

Methods and systems consistent with the present invention help reduce or eliminate stitch defects in LCD substrates. In one implementation, a step-and-scanning exposure technique is employed that does not suffer from the relatively slow speed of step-and-repeat systems. The exposure technique may include aligning a reticle along a scanning direction; and repeatedly exposing a reticle pattern onto a substrate and moving the plate by a half reticle width or less to thereby expose the whole substrate twice or more.

DETAILED DESCRIPTION

Figure 4:
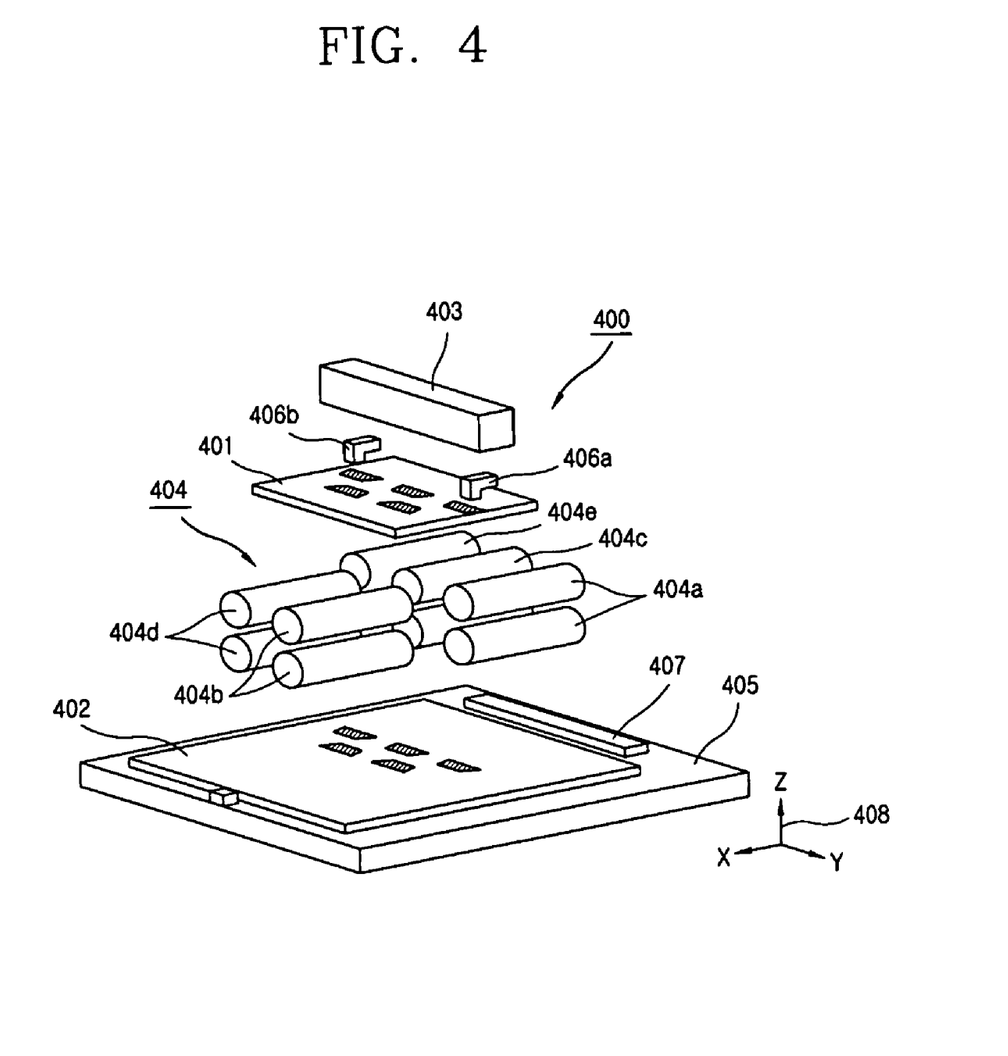
FIG. 4 is a perspective view illustrating a scanning exposure apparatus.

FIG. 4 is a perspective view illustrating a schematic construction of a scanning exposure apparatus 400. The apparatus 400 includes an illuminative optical system 403 for transcribing a pattern from a mask 401 onto a substrate 402, and a projective optical system 404 including multiple projective optical system modules 404a, 404b, 404c, 404de, and 404e. The apparatus 400 also includes a mask stage (shown in FIG. 5) for supporting the mask 401, a substrate stage 405 for supporting a glass substrate 402, and alignment detecting systems 406a, 406b.

FIG. 4 also shows a coordinate system 408, showing that the optical axis of the projection optical system 404 lies along the Z-axis. The direction of synchronous movement of the mask 401 and the glass substrate 402 (i.e., the scanning direction) lies along the Y-axis, perpendicular to the Z-axis. The movement direction of the glass substrate 402 may also be made along the X-axis. In other words, the substrate stage 405 moves in both in the X-direction and the Y-direction, carrying with it the glass substrate 402. When the mask 401 is scanned, the glass substrate 402 and the mask 401 may synchronously move in the Y-direction.

Figure 5:
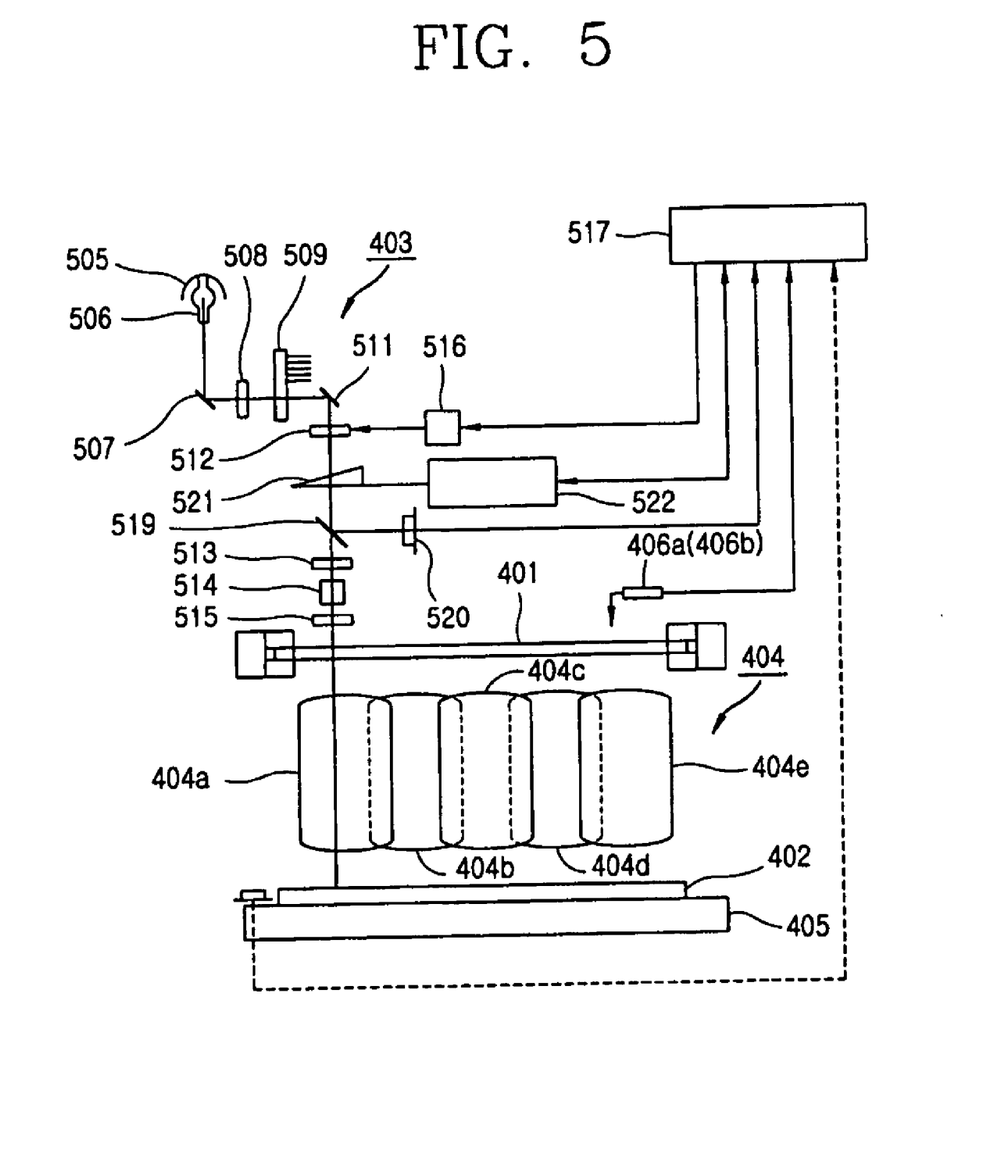
FIG. 5 is a schematic illustration of a scanning type exposure apparatus.

As shown in FIG. 5, the illumination optical system 403 emits a light beam (i.e., the exposure light) from a light source 506 such as an ultrahigh pressure mercury lamp. The illumination optical system 403 includes a dichroic mirror 507, a wavelength selecting filter 508, and a light guide 509. The illumination optical system 403 also includes illumination system modules disposed to provide light to each of the projective optical modules 404a–404e.

The light beam emitted from light source 506 is converged by the elliptical mirror 505, and is directed to the dichroic mirror 507. The dichroic mirror 507 reflects light having a selected exposure wavelength, while light of other wavelengths passes through. The light reflected by the dichroic mirror 507 is incident on the wavelength selecting filter 508. The filter 508 filters the incident light to pass a pre-selected wavelength of the incident light appropriate for conducting exposure by projection optical system 404. The filtered light is then directed to the light guide 509 that splits the filtered light into five beams. One beam is directed to each projective optical module 404a–404e via a reflecting mirror 511.

An exposure shutter 512 is also present and is freely movable in or out of the light path. During periods of non-exposure, the exposure shutter 512 is moved or inserted into the light path in order to stop light from reaching the mask 401. On the other hand, during exposure periods, the exposure shutter 512 is moved out of the light path in order to illuminate the mask 401.

To that end, a shutter operating unit 516 for advancing and retreating the exposure shutter 512 is installed in the optical system 403. A control unit 517 controls the shutter operating unit 516.

As noted above, light is diverged from the light guide 509 and is directed through each illumination system module 403 through the reflecting mirror 511.

Each illumination system module 403 includes an input illuminative system and a condenser optical system. In addition, the illuminative system modules 403 are arranged in X and Y directions at regular intervals. Thus, light from each illumination system module 403 illuminates a different region of the mask 401.

As shown in FIG. 5, the input illuminative system obtains a uniform illumination light beam from the light guide 509.

In addition, a light intensity adjustment mechanism is provided in the input illuminative system to control the intensity of light in the light beam.

Light transmitted through the light intensity adjustment mechanism reaches a fly eye lens 514 through a relay lens 513. The fly eye lens 514 will equalize illumination intensity on the condenser 515 (part of the condenser optical system). Thus, light transmitted through the fly eye lens 514 illuminates a region of the mask 401 uniformly through the condenser 515.

In addition, a light intensity monitoring mechanism is also provided in the condenser optical system. The light intensity monitoring mechanism monitors illumination intensity by reflecting part of the light incident on the half mirror 519 incident into a detector 520. The detected illumination intensity is output to the control unit 517. In response, the control unit 517 adjusts the light intensity to a predetermined value by monitoring and controlling the light intensity monitor and the light intensity adjusting mechanism.

Light transmitted through the mask 401 is incident into the projective optical system modules 404a–404e. As a result, the pattern in the illumination region of the mask 401 is exposed, as an equimultiple erect image, onto the glass substrate 402. More particularly, the pattern on the mask 401 is exposed onto resist coated on the glass substrate 402.

Each projective optical system module 404a–404e includes two groups of catadioptric systems, an image shift mechanism for moving a pattern image on the mask 401 in an X-direction or a Y-direction, and an image multiplier, an image rotator, and a field diaphragm.

Light transmitted through the mask 401 is incident into the image shift mechanism. The image shift mechanism shifts the image pattern on the mask 401 along the X-axis or the Y-axis. Light transmitted through the image shift mechanism is incident into the first catadioptric system.

The first catadioptric system forms an intermediate image of the mask image at the position occupied by the field diaphragm. The field diaphragm sets a projection region on the glass substrate 402. Light transmitted through the field diaphragm is incident into the second catadioptric system and is subsequently incident into the projection region on the glass substrate defined by the field diaphragm.

Figure 6:
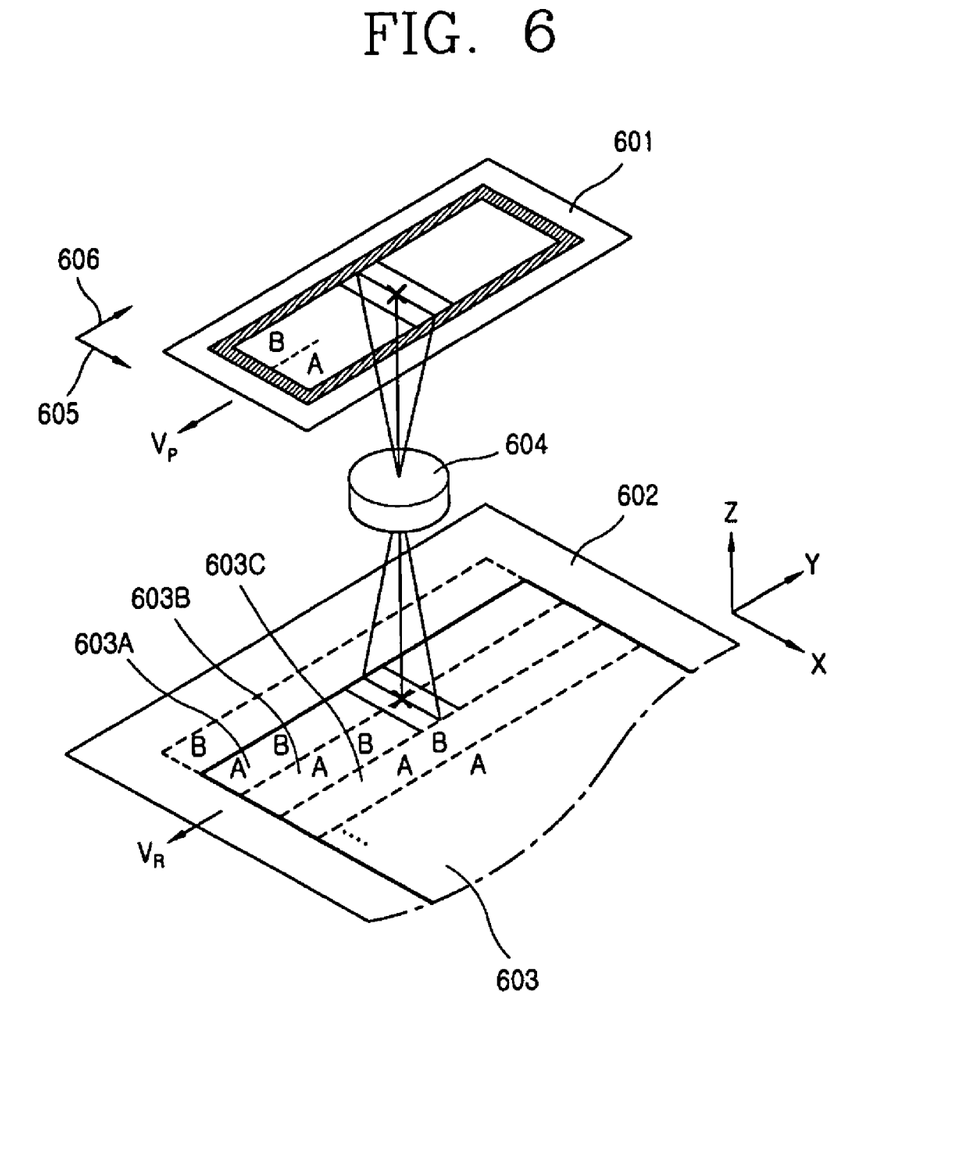
FIG. 6 is a perspective view illustrating a scanning exposure technique.

An exposure method that employs the scanning type projective exposure apparatus 400 is described next with reference to FIG. 6. FIG. 6 shows a reticle 601 on which an LCD substrate pattern is formed that is scanned by the apparatus 400, a projective optical system 604 that is movable and that includes multiple projective optical system modules, a glass substrate 602 (supported by a substrate stage) on which will be formed the LCD substrate, and an exposure region 603 that outlines the LCD substrate area that includes the pixel and transistor switching circuitry for the LCD substrate.

The scanning exposure apparatus 400 employs an equimultiple erect orthoscopic image scanning system. Accordingly the pattern on the reticle 601 is transcribed onto the glass substrate 602 without magnification or reduction (i.e., in a 1:1 proportion).

The projective optical system 604 scans the reticle 601 along the scanning direction (along the Y-axis) using a rectangular (slit-shaped) illumination region having a length direction 605 perpendicular to the scanning direction. As the reticle 601 is scanned, it is moved in the Y axis direction at a pre-selected speed VP. In one implementation, the longer side of the reticle 601 (disposed along the longer axis direction 606) is arranged to lie along the scanning direction (the Y axis direction). As a result, a relatively large exposure area is scanned across the glass substrate 602, and accordingly exposure time may be reduced.

The scanning projective exposure apparatus 400 is an equimultiple erect orthoscopic image scanning system, and thus may synchronize movement of the glass substrate 602 with the reticle 601. In other words, the glass substrate 602 is moved at speed VR, and VR and VP may be identical.

As described below, exposure is performed twice or more on the exposure region 603 of the glass substrate 602. In order to help illustrate an exposure process in which the exposure region 603 is exposed twice, the reticle 601 is shown to include a leading pattern section A and a trailing pattern section B. The dashed line separating the two pattern sections is for reference only and forms no part of the reticle pattern. The pattern in leading pattern section A is symmetric to the pattern in trailing pattern section B.

Initially, the longer axis direction 606 of the reticle 601 is arranged along the Y axis direction, the glass substrate 602 is arranged horizontal to the reticle 601 and one-half of the reticle pattern (the leading section A) is overlapped with an edge portion 603A of the exposure region 603. The apparatus 400 then scans the reticle pattern onto the exposure region 603 while the reticle 601 and the glass substrate move at speed VP=VR. Accordingly, as shown in FIG. 6, exposure is performed on the edge portion 603A of the exposure region 603 on the glass substrate 602. As a result, the edge portion 603A is exposed by the leading pattern section A, while the trailing pattern section B exposes an unused or non-resist coated outer portion beyond the edge portion 603A.

Next, the exposure apparatus 400 moves the glass substrate 602 along the –X axis one-half width of the reticle 601 (e.g., one-half of the length of the shorter side of the reticle 601). The reticle pattern is again scanned, and the reticle pattern is transcribed while the reticle 601 and the glass substrate 602 move at speed VP=VR. As a result, the edge portion 603A is exposed by the trailing pattern section B, which is symmetric to the leading pattern section A. Thus, the edge portion 603A has been exposed twice, while substrate portion 603B is newly exposed with the leading edge pattern section A.

Again, the exposure apparatus 400 moves the glass substrate 602 along the –X axis one-half width of the reticle 601. The exposure apparatus 400 again scans the reticle 601 to transcribe the reticle pattern onto the exposure region 603 of the glass substrate 602. As a result, the substrate portion 603B is exposed a second time, in this instance with the trailing pattern section B, while substrate portion 603C is newly exposed with the leading pattern section A.

By repeating the above-explained process, the whole exposure region 603 of the plate is exposed twice.

The exposure apparatus 400 prevents the generation of stitch defects on the exposure region 603 by exposing the exposure region 603 twice or more in the manner noted above. Thus, there are no minute overlap regions between distinct pattern sections on the exposure region 603 that are susceptible to stitch defects. In other implementations, the movement length along the –X axis of the glass substrate 602 may be less than one-half of the reticle pattern 601 width in order to expose the exposure region 603 more than twice. For example, the movement length may be one-third of the reticle pattern 601 width so that the exposure region 603 is exposed three times.

Figure 7:
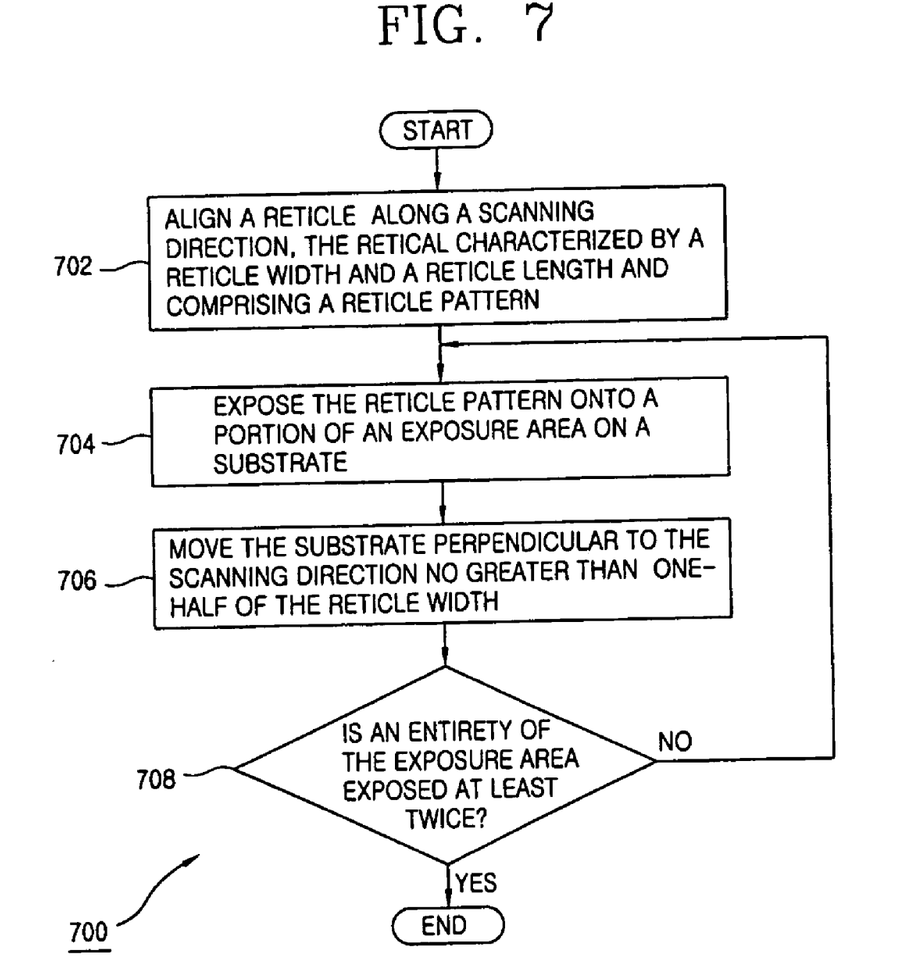
FIG. 7 is a process diagram showing the steps taken to fabricate an LCD substrate.

FIG. 7 is a process diagram showing the steps taken to fabricate an LCD substrate. Initially, the exposure apparatus 400 is setup to align a reticle along a scanning direction, the reticle characterized by a reticle width and a reticle length and comprising a reticle pattern (Step 702). Subsequently, the exposure apparatus 400 scans the reticle pattern along the reticle length onto a portion of an exposure area on a substrate (Step 704). Next, the exposure apparatus 400 moves the substrate perpendicular to the scanning direction no greater than one-half of the reticle width (Step 706). If the entirety of the exposure area has been exposed at least twice (Step 708), then the process is complete. Otherwise, the exposure apparatus 400 returns to Step 704 for another exposure.

As described above, by exposing the whole exposure region 603 of glass substrate 602 twice or more, stitch defects are prevented in the exposure region 603. Accordingly, manufacturing yield and LCD panel picture quality are improved.

What is claimed is:

1. An exposure method for fabricating a liquid crystal display substrate, the method comprising the steps of:
   aligning a reticle along a scanning direction, the reticle characterized by a reticle width and a reticle length and comprising a reticle pattern;
   exposing the reticle pattern onto a portion of an exposure area on a substrate;
   moving the substrate perpendicular to the scanning direction no greater than one-half of the reticle width; and
   repeating the exposing and moving steps, thereby exposing an entirety of the exposure area at least twice.

2. The exposure method of claim 1, where the reticle length is at least as wide as the exposure area.

3. The exposure method of claim 1, where the exposing step is performed while the reticle and the substrate are moved simultaneously.

4. The exposure method of claim 3, where the reticle and the substrate are moved in the same direction.

5. The exposure method of claim 1, where the exposing step comprises the step of scanning the reticle along a longer axis direction of the reticle.

6. The exposure method of claim 1, where the exposing step comprises illuminating along a length direction perpendicular to the scanning direction.

7. The exposure method of claim 1, where the reticle pattern is repetitive.

8. The exposure method of claim 1, where the exposing step comprises the step of equimultiple erect imaging to transcribe the reticle pattern onto the exposure region in 1:1 proportion.

9. The exposure method of claim 1, wherein the moving step comprises the step of moving the substrate approximately one-half of the reticle width.

* * * * *

UNITED STATES PATENT AND TRADEMARK OFFICE
CERTIFICATE OF CORRECTION

| | |
|---|---|
| PATENT NO. | : 7,211,372 B2 |
| APPLICATION NO. | : 10/723491 |
| DATED | : May 1, 2007 |
| INVENTOR(S) | : Soon-Young Park et al. |

Page 1 of 1

It is certified that error appears in the above-identified patent and that said Letters Patent is hereby corrected as shown below:

On the Title Page

In column 1, item (75), after "Soon-Young Park," delete "Gyungsangnam-Do" and substitute --Hadong-Gun-- in its place.

In column 1, item (75), after "Deok-Won Lee," delete "Kyunggi-Do" and substitute --Seongnam-- in its place.

Signed and Sealed this

Eighteenth Day of September, 2007

JON W. DUDAS
*Director of the United States Patent and Trademark Office*